United States Patent [19]

Sibley

[11] 4,097,764

[45] Jun. 27, 1978

[54] FAIL-SAFE SOLID STATE LOGIC

[75] Inventor: Henry C. Sibley, Adams Basin, N.Y.

[73] Assignee: General Signal Corporation, Rochester, N.Y.

[21] Appl. No.: 779,192

[22] Filed: Mar. 18, 1977

[51] Int. Cl.² ............................................. H02H 7/20
[52] U.S. Cl. ................................ 307/200 A; 307/291; 307/296 A; 307/218; 328/138
[58] Field of Search ........... 307/200 A, 200 B, 220 C, 307/225 C, 296 A, 218; 328/97, 99, 120, 7, 138; 367/291

[56] References Cited

U.S. PATENT DOCUMENTS

| 3,226,648 | 12/1965 | Davidson | 328/99 X |
| 3,328,702 | 6/1967 | Brown | 328/120 X |
| 3,721,833 | 3/1973 | Kramer | 328/7 X |
| 3,760,580 | 9/1973 | Fujita | 307/225 C |
| 3,909,632 | 9/1975 | Sibley | 328/97 X |

Primary Examiner—John S. Heyman
Attorney, Agent, or Firm—Milton E. Kleinman; John Ohlandt

[57] ABSTRACT

A fail-safe solid state logic system based on the use of an AC input signal of one type, and a DC input which causes a logical gate to convert the AC input signal to a totally different AC output signal; that is, to one adapted to be received by a vital driver or the like, which is tuned to accept only that different AC output signal and no other. Accordingly, the failures which are most likely to occur, namely, shorts from input to output or failure to toggle, result in the AC signal frequency not being changed and as a consequence, the system fails safe.

6 Claims, 4 Drawing Figures

FAIL-SAFE SOLID STATE LOGIC

BACKGROUND, OBJECTS AND SUMMARY OF THE INVENTION

This invention pertains to fail safe control circuitry, particularly for vehicle transportation control, and it more especially relates to fail safe solid state logic circuitry for such purposes.

A basic requirement imposed on logic circuitry for controlling transportation systems and the like is that the system be fail safe; that is to say, if a malfunction should occur this should result in the activation of a signal or the application of emergency equipment in such a way as to protect the passage of the vehicle and the security of its passengers. Accordingly, the logic control circuitry is so designed that any failure will produce a protective control signal.

It is highly desirable in such control circuitry to employ solid state logic devices, involving transistors and the like, forming AND and OR gates which are extremely small and inexpensive as compared to relay and other control circuitry that has been used for many decades. However, solid state devices can also fail and their failures are often random in occurrence and are sometimes difficult to recognize, thereby making it problematical to forecast accurately the effect of a malfunction.

Solutions to the aforestated difficulties have been proposed heretofore and one example may be seen in U.S. Pat. No. 3,471,689 which involves such transistorized switching circuits, but which judiciously includes a check on the proper functioning of the switching means involved in the logic circuitry. In other words, in addition to providing the needed indications of train absence and of train presence in the particular context of a railroad crossing system, that patent also provides what may be termed a parity checking method. That particular patent also embodies solid state "stick circuits" which are analogous to stick relays and which are initially energized from a first signal in conjunction with a second signal, being subsequently held in the energized state by the second signal. Thus, a stick circuit of this kind requires a defined signal pattern in order to keep the stick circuit in its set state or condition.

The present invention provides a logic circuit concept and a technique envisioned for use therewith. However, unlike logic circuitry known in the prior art, the present invention essentially provides that an output circuit connected to the logical block will accept only an AC signal which differs substantially from an AC signal at the logical block's input. In other words, a fundamental conversion or modification must occur within the logical block in order for the proper output signal to be generated. More particularly, in accordance with a specific aspect of the present invention, a logical AND gate is provided which is capable of producing an output when two or more inputs are present, means being provided which make it impossible for the proper AC output signal to appear unless the proper number of inputs appear, regardless of predetermined failures in the individual components of the AND gate.

Accordingly, it is a primary object of the present invention to provide a fail safe logical circuitry system which does not depend upon self checking or like arrangements and thus does not complicate the logical layout because of the need for such checking.

Another object of the invention is to provide such circuitry embodying reliable, conventional or standard components.

It is yet another object of the present invention to preclude certain types of unsafe failures that could exist in conventional prior art systems due to feed-throughs of a particular signal from input to output.

The above and other objects are achieved and implemented by reason of the aforesaid logical AND gate concept; that is, the concept of requiring an altered or modified AC output signal which will be ultimately accepted at a vital driver; only that signal and no other will be so accepted. Specifically, the logical AND gate in accordance with a preferred embodiment of the present invention uses an AC input signal of a predetermined frequency and an output circuit which accepts only a signal having half that frequency. Another input effectively acts to convert the input signal of predetermined frequency appearing at the one input to the required AC output signal having half that frequency.

One example of the manner in which the concept of the present invention is realized is by means of an inexpensive and reliable device that is readily available and which operates to change as indicated the character of an AC signal. Such device is a toggle flip-flop which effectively enables division of the frequency of the AC input signal by two. However, this basic element or logical block in accordance with the invention is so arranged that DC is applied as one of the logical inputs. Thus, the standard toggle flip-flop device is so utilized in the logical system as to have what is a normally applied fixed voltage source, selectively connected as a logical source or input; that is, connected to the logical DC input terminal only upon the occurrence of a predetermined event. This particular arrangement will become clear as the description proceeds.

The significant advantage obtained by the provision of a logical AND gate in accordance with the present invention is that the basic logical block is bound to fail in a safe manner, that is to say, the toggle flip-flop serving as the logical gate must fail safe because no failure can cause it to divide by a factor of more than two per stage. For example, the most likely failures to be encountered are shorts or feed-throughs from the input to output, or a failure to toggle. However, both of the aforenoted faults would result in the signal frequency not being changed, whereas what is required for proper acceptance at the output is that the input frequency be changed to half its value.

Other and further objects, advantages and features of the present invention will be understood by reference to the following specification in conjunction with the annexed drawing, wherein like parts have been given like numbers.

DESCRIPTION OF THE PREFERRED EMBODIMENT

Figure 1:
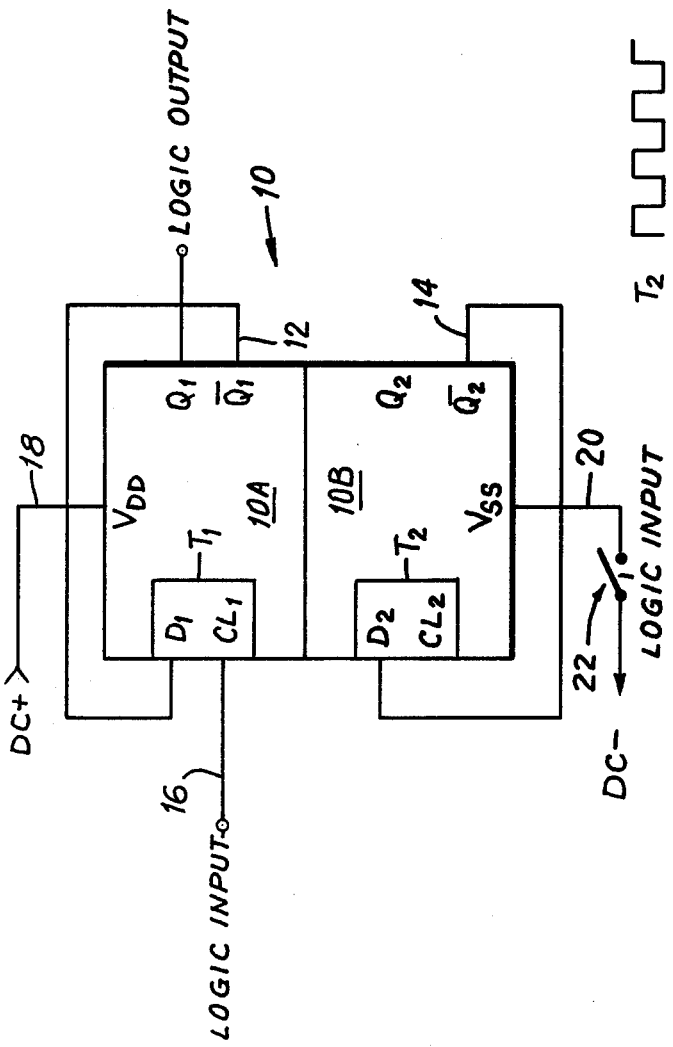
FIG. 1 is a block diagram of a logical AND gate involving a toggle flip-flop or similar component.

Referring now to the figures of the drawing, there will be seen a preferred embodiment of the solid state, fail-safe logic device. In FIG. 1 the principle of the invention is illustrated by an exemplary logical AND gate constructed in fulfillment of the fundamental object of the present invention. Specifically, there is shown a logical gate 10 in single block form. As already explained, this logical gate comprises a well-known, off-the-shelf, item, namely, a dual D type flip-flop of the integrated circuit family known as CMOS manufactured by RCA. The details of such a dual flip-flop device, including the schematic diagram therefor, can be appreciated by reference to a current RCA brochure on integrated circuits (File No. 479); such details are incorporated herein by reference.

For convenience, in FIG. 1 the upper half of the block is referred to as 10A, thus indicating the upper flip-flop of the aforesaid dual flip-flop; the lower half being designated 10B. Furthermore, for simplicity, the two terminals normally referred to as data and clock, have been combined (i.e., terminals D1, CL1 and D2, CL2) to constitute what hereinafter will be referred to respectively as terminals $T_1$ and $T_2$. By this designation of a toggle terminal it is understood that there is always provided a feedback connection 12 from, for example, the output terminal $\overline{Q}_1$ to the data terminal D1. Similarly, it will be understood that a feedback connection 14 is provided for the other half, or other flip-flop, of the device 10.

It should be noted that the conventionally available dual D type flip-flop is normally provided with a great variety of terminals so that multiple functions can be achieved. However, for purposes of the present invention, certain of these terminals are unused. Accordingly, these unused terminals have not been indicated in the block diagram of FIG. 1. These terminals, for example, are for set and reset purposes and the like.

An AC logic input such as a clock pulse is supplied to the toggle terminal $T_1$ by way of the line or connection 16. Also connected to the device 10 are a number of DC voltage supplies. At the top of the figure it will be seen that a source of positive DC (DC+) is provided by the connection 18 to the upper voltage terminal $V_{DD}$ for the several components of device 10. Similarly, a source of negative voltage (DC−) is supplied as the other supply or reference voltage, it being understood that these upper and lower supply voltages can take on a variety of values. The lower reference voltage terminal is designated $V_{SS}$ and the connection is by way of line 20.

It should be especially noted that the supply of DC− selectively furnished by reason of the operation of switch 22 which generally designates any means, such as relay contacts or the like, for providing connection of DC− upon the occurrence of particular events. It will therefore be understood that the logic output which is provided at the output $Q_1$ is an output which results from the occurrence of a logic input to toggle T1, that is, an AC signal of appropriate frequency, AND the further occurrence of closure of switch 22 so as to connect the source DC− to $V_{SS}$ and hence to provide suitable voltage to each of the components of the dual flip-flop 10.

It will be understood that in the simple example selected for illustration in FIG. 1, the dual flip-flop has only one-half of its circuitry utilized for the purpose of performing the logical AND function. However, it will be appreciated as the description proceeds that both halves of this off-the-shelf item can be used in certain other contexts, although only one independent logic stage can be realized.

From the preceding description, it will be appreciated by those skilled in the art that the device 10 in FIG. 1 is exploited to convert an AC input signal to a different AC output signal; that is, to one having an entirely different frequency, and that this is accomplished by reason of the fact that the DC input so causes the gate device to convert this AC input signal. Furthermore, that in the particular example illustrated of a toggle flip-flop, the frequency of the input signal is divided by two. This divided-by-two output signal is the only signal that will be accepted at the final or ultimate stage in what is known as a vital driver. Such a vital driver is a device well-known to those in the signaling arts, particularly in railroad signaling, and one example of a vital driver is disclosed in U.S. Pat. No. 3,958,782 the details of which are incorporated herein by reference. From a practical standpoint it has been determined that a useful frequency is 10 kHz for such a vital driver. Accordingly, in the example of FIG. 1, the logic input connected by line 16 to T1 would have a frequency of 20 kHz in order that the logic output would have a frequency of 10 kHz.

Although the general principle of the fail-safe logic concept of the present invention has been illustrated in FIG. 1 by the example of a toggle flip-flop involving frequency division by two, the frequency division could be different, or even frequency multiplication could be invoked. Moreover, this same type of logic could be implemented using modulators instead of frequency dividers or multipliers. In the former case, the inputs would be two AC signals having widely different frequencies.

Figure 3:
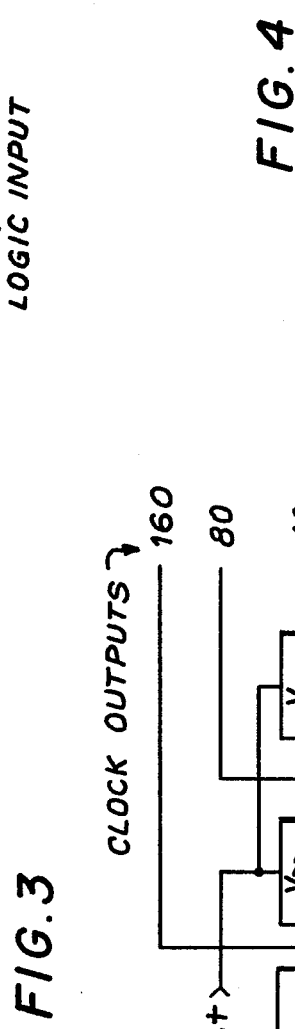
FIG. 3 is a block diagram of the clock circuit which is adapted to be connected to the circuit of FIG. 2.
Figure 2:
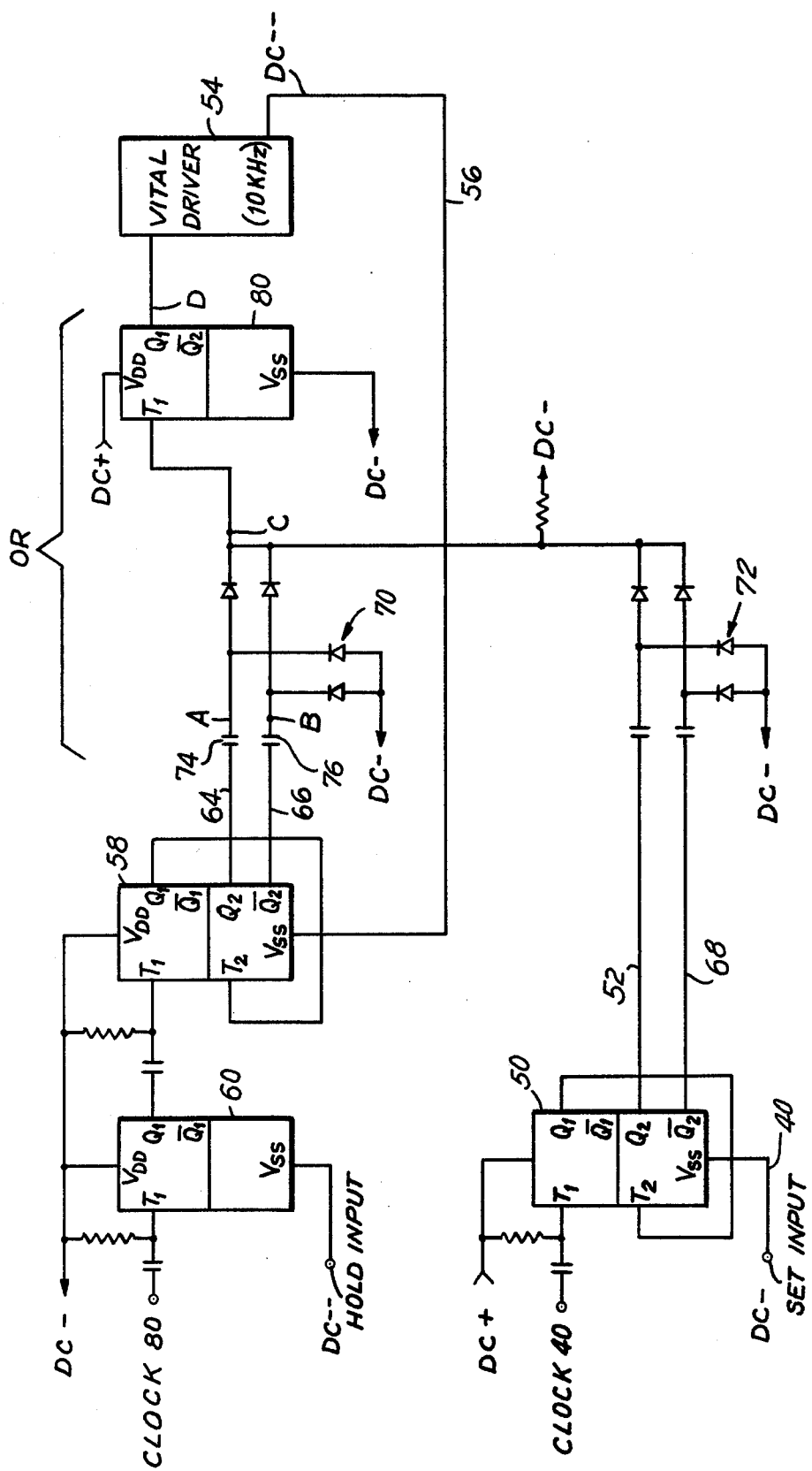
FIG. 2 is a block schematic diagram illustrating a so-called safe latching device or circuit.

Referring now to FIGS. 2 and 3 of the drawing, there is illustrated in these two figures a more sophisticated logic subsystem that might typically be used in connection with a highway crossing system or the like. Such a logic sub-system uses clock outputs as indicated in FIG. 3 coming from a source or oscillator 30. Frequency dividers are used in connection with the basic or fundamental oscillator output, which is 160 kHz, so as to obtain the other clock outputs, namely, 80, 40 and 20 kHz. The divided values result from the process already described, that is, frequency division by two by means of connecting the output of the oscillator 30 to a first dual flip-flop 32 by which the fundamental is changed to 80 kHz; then by further division to 40 kHz by means of the upper half, and thereafter to 20 kHz in the lower half, of the dual flip-flop 34. Thus, the dual flip-flop 34 has its first output $Q_1$ connected to the toggle input T2 of the lower half of the device 34, thereby further dividing to obtain the 20 kHz output.

It will be understood that the various clock inputs to the chain of logic illustrated in FIG. 2 are derived from the several clock outputs of FIG. 3, the latter being selected either from the oscillator directly so as to provide 160 kHz, or from one of the divider stages illustrated in accordance with the number of logic gates ahead of a particular vital driver in the logic chain. If it were found to be desirable not to employ the dividers 32 and 34 as part of the clock outputs, these frequency dividers could be added instead in a particular logic chain when required.

The so-called safe latch illustrated in FIG. 2 is an arrangement which provides that when a set input is provided to the line 40, seen at the lower left, the concurrence of this Dc input AND the designated AC input signal, namely, clock 40, to the toggle input T1 of the upper flip-flop of device 50, will result in obtaining 20 kHz at the upper output $Q_1$, this output in turn being connected to the toggle input T2 of the lower half of device 50. Again, frequency division by two takes place with the result that a frequency of 10 kHz is provided at the lower output $Q_2$ and is transmitted on line 52.

It will be apparent to those skilled in the art that the signal appearing at the set input is a necessary precondition for the hold input signal, which is provided in the upper channel or path of the safe latch, to be rendered effective or enabled to reach the vital driver 54 at the upper right in FIG. 2. The reason for this is that the vital driver controls the enabling of the dual flip-flop gate device 58 by means of feedback path 56 which transmits a DC potential designated DC— —, commonly referred to as super-minus, meaning that it is much more negative than the regular supply voltages. Typically, DC— — would have a value of —6 volts, whereas DC— would be 0 volts and DC+ would be +6volts.

Accordingly, this super-minus value of voltage must be fed back to the dual flip-flop gate device 58 in order to enable this device so as to permit the hold input signal to be fed through and affect the vital driver. In other words, a signal at the hold input is ineffective unless and until the set input has caused the enablement of the upper pathway or channel such that the hold signal can be gated through to the vital driver 54. However, once this enablement has been accomplished with respect to the device 58, the input signal at the set input can terminate and the vital driver will then still be supplied with an input signal so long as the hold input signal (also DC— —) remains.

It will be accordingly appreciated that the devices 50 and 58, as well as device 60, are applications of the principle already explained in connection with FIG. 1; that is, these are all frequency-coverting logical AND gates whose operation is dependent upon the occurrence of both a clock or AC signal at a toggle input AND the presence of DC resulting from certain predetermined events in order to produce the proper AC output signal. In the case of device 58, as explained, the event is dependent upon the occurrence of a signal (DC—) at the set input of device 50 in order to provide a super-minus (DC— —) feedback sigal that will enable the device 58. Hence it will be appreciated that once this feedback signal has been initiated, then so long as the AC input clock signal is provided at the input $T_1$ of device 58, a signal will continue to be supplied to the input of vital driver 54. However, once the signal at the hold input terminates, and the set signal has already terminated, the whole system reverts to its initial condition. Thereafter, it is required that another signal occur at the set input to recommence the operation as just described.

The middle portion of the safe latch circuit of FIG. 2 has been designated OR and this middle portion provides the required function. However, this function requires special consideration and treatment because the phase relation between two frequency dividers is not determined. Thus there might occur the possibility of an out-of-phase relationship between the output on line 52 from the device 50 which provides frequency division and the output on the line 64 coming from the output $Q_2$ of frequency dividing device 58. This is so even though each of these output lines is provided with an output frequency of 10 kHz. It will be appreciated that the clock 80 signal goes through three halving divisions since it goes through the upper stage of device 60 and through the two flip-flop stages of device 58. On the other hand, the 10 kHz output on line 52 results from two halving divisions from the originating clock signal designated clock 40.

In order to overcome the aforesaid phase relationship difficulty, an additional line 66 is taken from the $\bar{Q}_2$ output of device 58 and a further line 68 is connected to the $\bar{Q}_2$ output of device 50. Such arrangement insures that the ultimate inputs will not only be of the same frequency, but will correspond in phase. This is accomplished through frequency doubling by means of the full wave rectifiers, designated 70 in the upper channel and 72 in the lower channel. It will be seen from the pulse diagram of FIG. 4, assuming that a pulse form occurs at the input T2 of the device 58 as shown at the top of the figure, that the pulse forms $Q_2$ and $\bar{Q}_2$ will appear at those respective outputs of device 58 and hence they will so appear on the lines 64 and 66. Due to the capacitors 74 and 76 in these lines, a differential or spike form will result at the points A and B. Accordingly, at the output of the frequency doubler 70, the pulse form C will result. When this pulse form is applied to flip-flop device 80, the consequence will be the pulse output seen at point D. This device 80 is a conventional flip-flop; that is to say, it does not perform logic but simply has the two plus and minus voltage supplies so conventional fixed biases connected to the components of such flip-flop.

Figure 4:
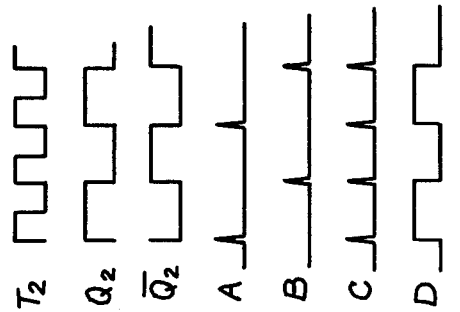
FIG. 4 is a pulse diagram illustrating the pulse trains or forms appearing at various points in the circuit of FIG. 2.

Since the pulse forms present on the output lines 52 and 68 are either duplicates or complements of the respective pulse forms A and B shown in FIG. 4, then the output of flip-flop 80 accurately carries out or performs the OR function from the two parallel channels; that is to say, the output of the flip-flop 80 corresponds with the OR function of the inputs at point C from both of the channels. Furthermore, since the pulses at the point C (FIG. 4) occur at a frequency twice that of the inputs A and B to the frequency doubler, the AND gates defined by the devices 50 and 58 divide by four such that there is minimum danger that stray coupling of an input frequency can cause an acceptable output. Since most readily available logic flip-flops such as the dual flip-flop discussed occur in these packages having two halves or stages and since only one stage in a package can be used for logic, it is not inconvenient to require that some AND gates divide by four while others divide by two.

It will be clear from the preceding description that the safe latch device of FIG. 2 is simply one illustration of a fairly sophisticated circuit involving the principle of the present invention and that other further and even more sophisticated logic schemes can be envisioned. Moreover, that such logic schemes would be incorporated in systems such as railroad crossing systems and like arrangements.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. A fail-safe logic device, comprising
a solid state, toggle flip-flop AND gate having an output at which a binary one signal appears provided a first AC digital signal, representative of a binary one, applied to a first input occurs concurrently with another digital signal, also representative of a binary one, applied to a second input;
first means for applying such first AC digital signal to said first logic input of said device;
second means for applying said other digital signal at a DC voltage power supply terminal of said logic device as a second logic input of said device;
a vital driver coupled to said output of said toggle flip-flop AND gate, said vital driver being operative to accept only an output AC signal which is one-half the frequency of the AC digital signal at the first input, whereby any lack of conversion, due to a short or the like from input to output, will result in rejection of the unconverted, or wrong-frequency, signal then appearing at said output.

2. A device as defined in claim 1, further including means connected between said toggle flip-flop AND gate and said second digital signal-applying means for rendering operative said AND gate, whereby any lack of conversion disconnects said DC voltage supply.

3. A fail-safe logic device, comprising
a plurality of toggle flip-flop AND gates as defined in claim 1;
a vital driver coupled to the output of a first of said toggle flip-flop AND gates;
means for feeding back a DC signal from said vital driver to said first of said AND gates in response to a signal originating at the input of a second of said AND gates;
an OR circuit connected to both of said AND gates so as to transmit either the output from said first or from said second AND gate to said vital driver;
a toggle flip-flop forming part of said OR circuit and connected to said vital driver for halving the input frequency thereto so as to obtain the signal of predetermined frequency for said vital driver.

4. An apparatus as defined in claim 3, further including a pair of channels or paths, each comprising a pair of lines, connected to said OR circuit and a frequency doubling device in each of said paths.

5. Apparatus as defined in claim 4, further including a third toggle flip-flop AND gate having a clock source connected to its input, its output being connected to the input of said first toggle flip-flop AND gate.

6. Apparatus as defined in claim 3, in which said vital driver is energized so long as a set input signal exists at said first AND gate OR a hold input signal exists at said second AND gate and the precondition of the concurrent appearance of a set input signal has been fulfilled.

* * * * *